US008325493B2

(12) United States Patent
McClellan et al.

(10) Patent No.: US 8,325,493 B2

(45) Date of Patent: Dec. 4, 2012

(54) ALIGNMENT PIN FOR RETAINING A MODULE ON A CIRCUIT BOARD

(75) Inventors: Justin S. McClellan, Camp Hill, PA (US); Nathan W. Swanger, Mechanicsburg, PA (US); James Lee Fedder, Etters, PA (US); Lee Andrew Barkus, Millersburg, PA (US)

(73) Assignee: Tyco Electronics Corporation, Berwyn, PA (US)

( * ) Notice: Subject to any disclaimer, the term of this patent is extended or adjusted under 35 U.S.C. 154(b) by 244 days.

(21) Appl. No.: 12/822,608

(22) Filed: Jun. 24, 2010

(65) Prior Publication Data

US 2011/0317375 A1 Dec. 29, 2011

(51) Int. Cl.
*H05K 7/14* (2006.01)
*H05K 7/18* (2006.01)

(52) U.S. Cl. .......................... 361/801; 361/807; 361/802

(58) Field of Classification Search .......... 361/801–803, 361/807, 810, 679.01, 749, 759, 784; 174/138 E, 174/138 G See application file for complete search history.

(56) References Cited

U.S. PATENT DOCUMENTS

| | | | | |
|---|---|---|---|---|
| 4,701,984 | A * | 10/1987 | Wyckoff | 24/581.1 |
| 4,781,488 | A * | 11/1988 | Hayashi | 403/408.1 |
| 4,786,225 | A * | 11/1988 | Poe et al. | 411/32 |
| 5,632,649 | A * | 5/1997 | Spangler | 439/567 |
| 6,711,030 | B2 * | 3/2004 | Akiba | 361/803 |
| 6,898,083 | B1 | 5/2005 | Hornung | |
| 7,090,507 | B2 | 8/2006 | Wertz et al. | |
| 7,394,666 | B2 * | 7/2008 | Edwards et al. | 361/803 |
| 8,092,230 | B2 * | 1/2012 | Swanger et al. | 439/65 |

* cited by examiner

*Primary Examiner* — Hung S Bui

(57) ABSTRACT

An alignment pin is provided. The alignment pin includes an alignment member that is configured to extend from a surface of a circuit board. The alignment member has a flange that engages an electronic module. The flange aligns and retains the electronic module on the circuit board. A coupling member extends from the alignment member. The coupling member is configured to be through hole mounted to an aperture in the circuit board. The coupling member has a retention feature that creates a press-fit between a surface of the aperture and the coupling member. The coupling member has a cross-sectional width at the retention feature that is greater than a diameter of the aperture. The retention feature accommodates a press-fit with apertures having different diameters.

20 Claims, 7 Drawing Sheets

ALIGNMENT PIN FOR RETAINING A MODULE ON A CIRCUIT BOARD

BACKGROUND OF THE INVENTION

The subject matter herein relates generally to printed circuit boards and, more particularly, to an alignment pin for retaining an electronic module on a printed circuit board.

Circuit boards include electrical connectors that engage electronic modules positioned on the circuit board. The electrical connectors electrically join the electronic module and the circuit board. The electrical connectors may also form a mechanical connection between the electronic module and the circuit board. Additionally, alignment pins may be used to align an electronic module with respect to an electrical connector on the circuit board. An end of the alignment pin is through-hole mounted into an aperture formed in the circuit board. Another end of the alignment pin engages the electronic module to align an electrical connector of the electronic module with an electrical connector of the circuit board.

However, alignment pins typically require additional manufacturing. Specifically, the apertures in the circuit board are generally formed with varying diameters due to inconsistencies in manufacturing. Accordingly, the alignment pins may not fit properly within the apertures. Typically, alignment pins are tailor fit to a specific aperture into which the alignment pin is to be inserted. Tailor fitting the alignment pins requires additional manufacturing time and costs. An alignment pin is also restricted to use within the aperture for which the alignment pin was tailor fit. Replacing the alignment pin requires further manufacturing and costs to tailor fit a new alignment pin.

Accordingly, there is a need for an alignment pin that retains an electronic module on a circuit board without the need to tailor fit the alignment pins for apertures formed in the circuit board.

SUMMARY OF THE INVENTION

In one embodiment, an alignment pin is provided. The alignment pin includes an alignment member that is configured to extend from a surface of a circuit board. The alignment member has a flange that engages an electronic module. The flange aligns and retains the electronic module on the circuit board. A coupling member extends from the alignment member. The coupling member is configured to be through hole mounted to an aperture in the circuit board. The coupling member has a retention feature that creates a press-fit between a surface of the aperture and the coupling member. The coupling member has a cross-sectional width at the retention feature that is greater than a diameter of the aperture. The retention feature accommodates a press-fit with apertures having different diameters.

In another embodiment, an electronic assembly is provided. The assembly includes a circuit board having an electrical pin assembly positioned thereon. The circuit board has an aperture extending therethrough. An electronic module is electrically coupled to the electrical pin assembly. An alignment pin aligns the electronic module on the circuit board. The alignment pin includes an alignment member having a flange that engages the electronic module. The flange aligning and retaining the electronic module on the circuit board. A coupling member extends from the alignment member. The coupling member is through hole mounted to the aperture in the circuit board. The coupling member has a retention feature that creates a press-fit between a surface of the aperture and the coupling member. The coupling member has a cross-sectional width at the retention feature that is greater than a diameter of the aperture. The retention feature accommodates a press-fit with apertures having different diameters.

DETAILED DESCRIPTION OF THE DRAWINGS

The foregoing summary, as well as the following detailed description of certain embodiments will be better understood when read in conjunction with the appended drawings. As used herein, an element or step recited in the singular and proceeded with the word “a” or “an” should be understood as not excluding plural of said elements or steps, unless such exclusion is explicitly stated. Furthermore, references to “one embodiment” are not intended to be interpreted as excluding the existence of additional embodiments that also incorporate the recited features. Moreover, unless explicitly stated to the contrary, embodiments “comprising” or “having” an element or a plurality of elements having a particular property may include additional such elements not having that property.

Figure 1:
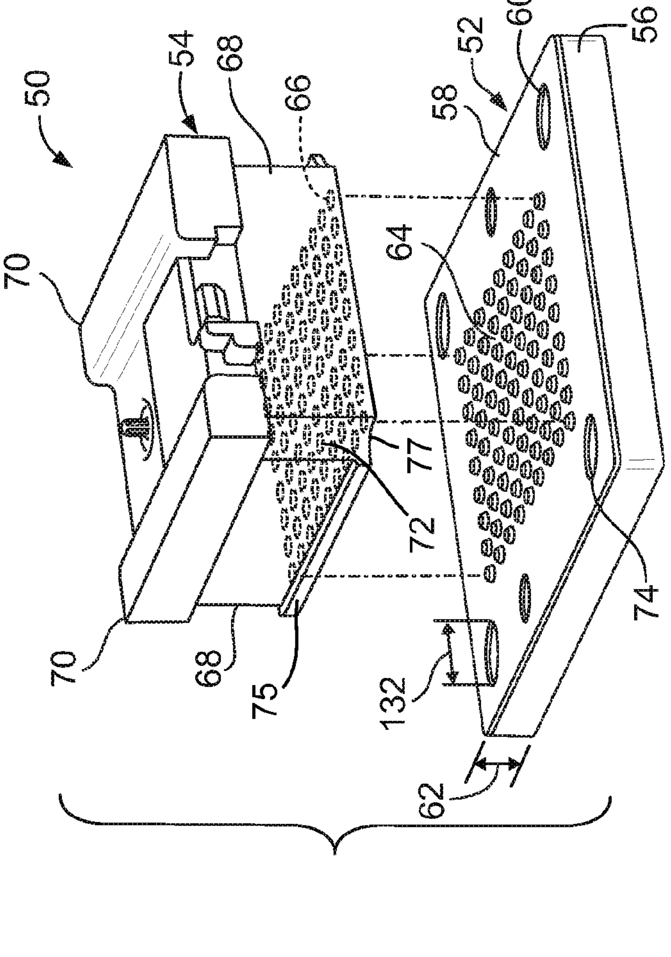
FIG. 1 is an exploded view of an electronic assembly.

FIG. 1 illustrates an electronic assembly 50 having a circuit board 52 and an electronic module 54. The module 54 is configured to electrically and mechanically couple to the circuit board 52. The circuit board 52 includes a base 56 and a circuitry layer 58 positioned on the base 56. In an exemplary embodiment, the base 56 is a reinforced epoxy laminate, for example a woven fiberglass cloth with an epoxy resin. The base 56 may be FR-4 graded by the National Electrical Manufactures Association and may be flame resistant. The base 56 includes apertures 60 extending therethrough. The apertures 60 extend an entire depth 62 of the base 56. The apertures 60 may be configured to receive pins and/or posts that align the module 54 with respect to the circuit board 52. The apertures have an inner surface 74 and a diameter 132. The apertures 60 may have varying diameters 132 due to manufacturing inconsistencies. In an example embodiment, the apertures 60 also extend through the circuitry layer 58.

The circuitry layer 58 may be formed from a layer of insulative material, such as a polyimide material having a high heat and chemical resistance. For example, the insulative material may be any one of Apical, Kapton, UPILEX, VTEC PI, Norton TH, Kaptrex, or a combination thereof. Conductive pathways, for example, signal traces and/or power traces may extend through the insulative material. The insulative material reduces an amount of heat conducted by the conductive pathways. An electrical connector 64 is positioned on the circuitry layer 58. The electrical connector 64 may electrically engage the conductive pathways extending through the circuitry layer 58. In the exemplary embodiment, the electrical connector 64 is a 9×9 pin assembly. Alternatively, the electrical connector 64 may include any number of pins. In another embodiment, the electrical connector 64 may be any suitable connector for coupling to the module 54.

The module 54 may be any suitable module for a circuit board, for example, a voltage regulator module, a power module, a network module, an input/output module, a storage module, a connector module, a processing module, or the like. The module 54 includes an electrical connector 66. The electrical connector 66 joins to the electrical connector 64. In the exemplary embodiment, the electrical connector 66 is a 9×9 pin assembly. Alternatively, the electrical connector 66 may include any number of pins. In another embodiment, the electrical connector 66 may be any suitable connector for joining to the electrical connector 64. The electrical connectors 64 and 66 provide electrical engagement between the circuit board 52 and the module 54. In an exemplary embodiment, the electrical connectors 64 and 66 also provide mechanical coupling between the circuit board 52 and the module 54. The electrical connectors 64 and 66 may retain the module 54 on the circuit board 52.

The module 54 also includes sides 68. The sides 68 intersect to form corners 70. A recess 72 is formed in each corner 70. Alternatively, a recess 72 may only be formed in some of the corners 70. Recesses 72 may also be formed at any intermediate location along any side 68 of the module 54. The recesses 72 may be utilized to align the module 54 with respect to the circuit board 52, as described in more detail below. A module substrate 75 is provided at the bottom of the module 54. A rounded recess 77 in the substrate 75 is formed below the recess 72 in the module 54.

Figure 2:
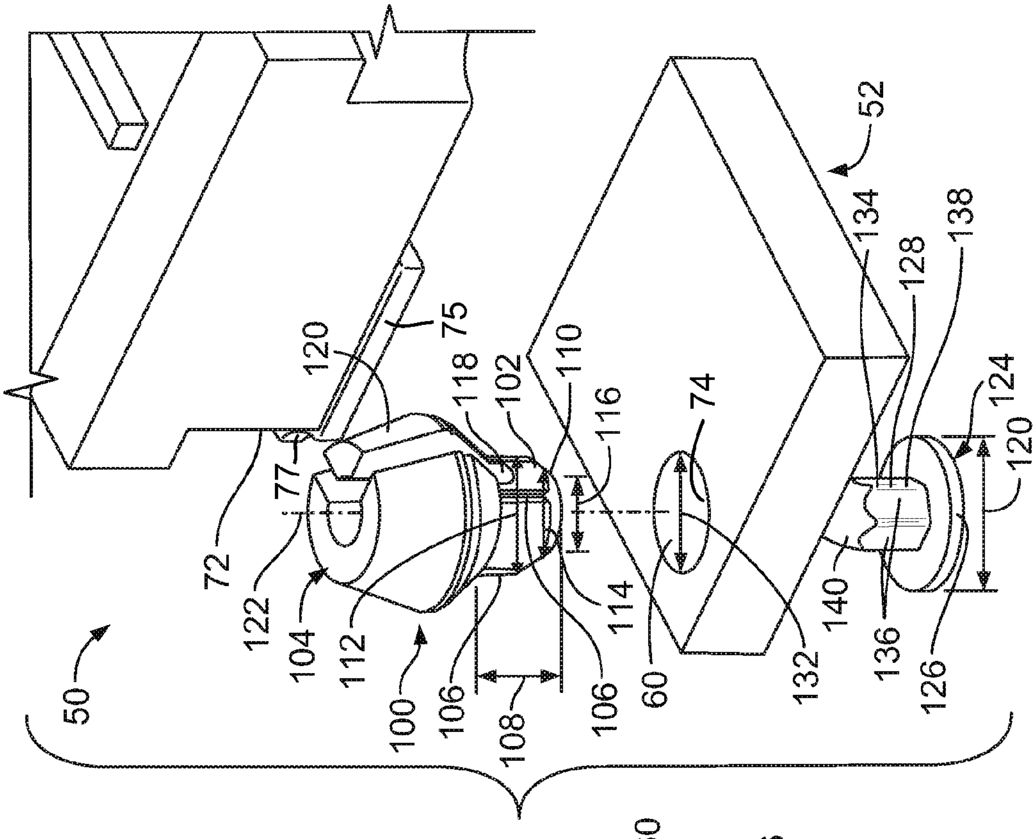
FIG. 2 is an exploded view of the electronic assembly, shown in FIG. 1, coupled with an alignment pin formed in accordance with an embodiment.

FIG. 2 is an exploded view of the electronic assembly 50 coupled with an alignment pin 100. The alignment pin 100 is configured to align and retain the module 54 with respect to the circuit board 52. The alignment pin 100 is configured to be received within an aperture 60 formed in the circuit board 52. The alignment pin 100 also engages the module 54 to align the electrical connector 66 (shown in FIG. 1) of the module 54 with the electrical connector 64 of the circuit board 52. The alignment pin 100 includes a coupling member 102 and an alignment member 104. The coupling member 102 is configured to be received within the aperture 60 of the circuit board 52. The alignment member 104 is configured to engage the module 54 to align and retain the module 54 with respect to the circuit board 52.

In one embodiment, the alignment member 104 engages the recess 77 of the module substrate 75 to align and retain the module 54 on the circuit board 52. The alignment member 104 includes a flange 120. The flange 120 is rounded to correspond to the recess 77 formed on the module substrate 75. Alternatively, the flange 120 and the recess 77 may have any corresponding shapes. The alignment member 104 may also include a rib, a notch, a rail, or the like that is configured to engage a corresponding feature on the module 54. The flange 120 may be flexible and configured to move inward toward an axis 122 of the alignment pin 100. The movement of the flange 120 may enable modules 54 having varying sizes to couple to the circuit board 52. The flange 120 may generate a force on the module 54 to secure the module 54 to the circuit board 52.

The coupling member 102 is sized to be inserted into the aperture 60. The coupling member 102 may include retention features 106 that create a press-fit with the inner surface 74 of the aperture 60. The retention features 106 are illustrated as ribs that extend a portion of a length 108 of the coupling member 102. The retention features 106 may extend less than the length 108 of the coupling member 102 or may extend the entire length 108 of the coupling member 102. The coupling member 102 may include any number of retention features 106. The coupling member 102 has a width 112 at the retention features 106. The width 112 is greater than the diameter 132 of the aperture 60. The retention features 106 are deformable so that the coupling member 102 is press-fit with the inner surface 74 of the aperture 60. Alternatively, the inner surface 74 of the aperture 60 may deform to form a press-fit with the coupling member 102. In another embodiment, both the retention features 106 and the inner surface 74 deform. The retention features 106 are sized to accommodate a press-fit coupling between the coupling member 102 and apertures 60 having varying diameters 132.

The coupling member 102 also includes a tapered end 110 that may function as a retention feature that provides a press-fit between the coupling member 102 and the inner surface 74 of the aperture 60. In an embodiment, the coupling member 102 may include only one of the retention features 106 and the tapered end 110. The tapered end 110 narrows from a width 114 to a width 116 at an end of the coupling member 102. In an embodiment that does not include the retention features 106, the tapered end 110 may function as a retention feature, wherein the width 116 of the tapered end 110 is less than the diameter 132 of the aperture 60 to enable the coupling member 102 to be inserted therein. The width 114 of the tapered end 110 may be greater than the diameter 132 of the aperture 60 so that the coupling member 102 deforms to press-fit within the inner surface 74 of the aperture 60. Alternatively, the inner surface 74 of the aperture 60 may deform to receive the coupling member 102. In another embodiment, both the inner surface 74 and the coupling member 102 deform.

The coupling member 102 also includes a recess 118. The coupling member 102 may include any number of recesses 118. The recess 118 creates an area where there is no interference between the coupling member 102 and the aperture 60 when the coupling member 102 is inserted into the aperture 60. The recess 118 may enable deformation of the coupling member 102 during insertion into the aperture 60. The deformation enables the coupling member 102 to be inserted wholly into the aperture 60.

A stuffer pin 124 is configured to be received in an opening (not shown) formed in the coupling member 102. The stuffer pin 124 locks the coupling member 102 to the circuit board 52. The stuffer pin 124 includes a base 126 and a pin member 128 extending from the base 126. The pin member 128 is received within the opening of the coupling member 102. The base 126 has a diameter 130 that is greater than the diameter 132 of the aperture 60. The base 126 is configured to position flush against the circuit board 52 when the stuffer pin 124 is inserted into a coupling member 102.

The pin member 128 includes retention features 134. The retention features 134 create a press-fit between the stuffer pin 124 and the coupling member 102. In the illustrated embodiment, the pin member 128 includes flat sides 136 that intersect at corners 138. A retention feature 134 is formed at each corner 138. The corners 138 contact an inner surface of the opening formed in the coupling member 102 to create the press-fit between the stuffer pin 124 and the coupling member 102. The corners 138 may deform to create the press-fit with the coupling member 102. Alternatively, the opening in the coupling member 102 may deform to receive the corners 138. In another embodiment, both the opening in the coupling member 102 and the stuffer pin 124 deform. The pin member 128 also includes a tapered end 140. The tapered end 140 may also function as a retention feature to create a press-fit with the coupling member 102.

Figure 3:
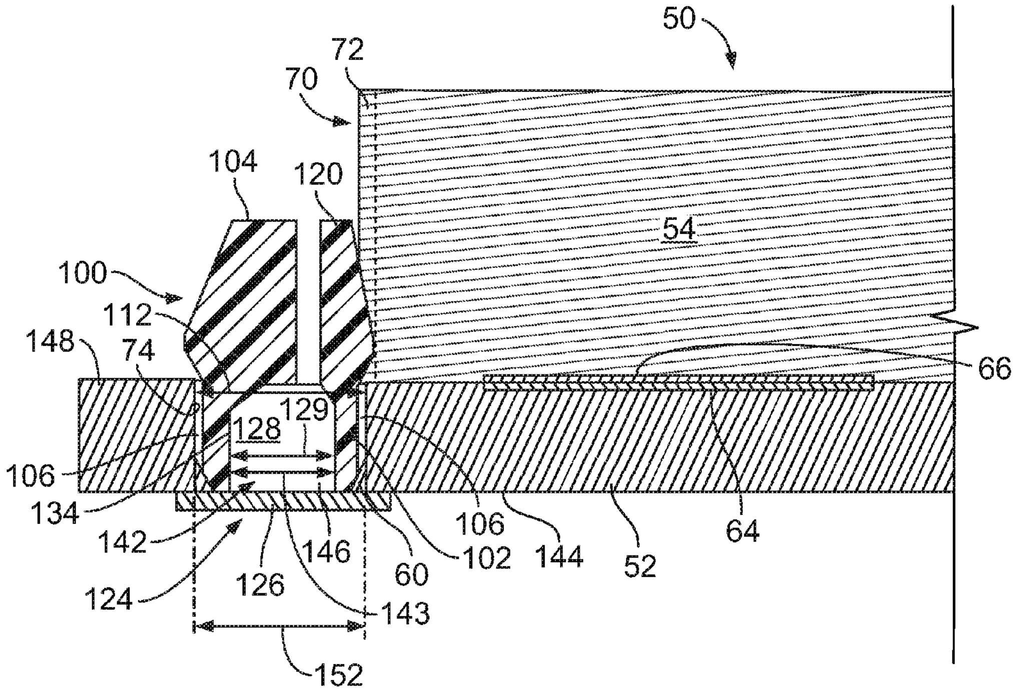
FIG. 3 is a cross-sectional view of the electronic assembly, shown in FIG. 2.

FIG. 3 is a cross-sectional view of the electronic assembly 50 in an assembled configuration. The alignment pin 100 is inserted into the circuit board 52 to position the module 54 with respect to the circuit board 52. The electrical connector 66 of the module 54 is engaged with the electrical connector 64 of the circuit board 52. The alignment member 104 of the alignment pin 100 extends from a top surface 148 of the circuit board 52. The alignment member 104 is engaged with the module 54 to align the electrical connector 66 with the electrical connector 64. In the illustrated embodiment, the flange 120 is positioned flush with the rounded recess 72 of the module 54. The flange 120 provides a force on the module 54 to secure the module 54 to the circuit board 52. The illustrated embodiment shows only one alignment pin 100. The electronic assembly 50 may include any number of alignment pins 100. For example, an alignment pin 100 may be positioned at each corner 70 of the module 54. The module 54 is retained and secured between the alignment pins 100.

The coupling member 102 is fully inserted into the aperture 60. Alternatively, the coupling member 102 may only be partially inserted into the aperture 60. Prior to engagement with the aperture 60, the coupling member 102 has a width 112 at the retention features 106 that is greater than the diameter 132 of the aperture 60. The retention features 106 of the coupling member 102 are deformed so that the coupling member 102 is received in the aperture 60. The retention features 106 deform to provide a press-fit with the inner surface 74 of the aperture 60. Alternatively, the inner surface 74 of the aperture 60 may deform to form a press-fit with the retention features 106. In another embodiment, both the retention features 106 and the inner surface 74 of the aperture 60 are deformable.

The pin member 128 of the stuffer pin 124 is received in an opening 142 formed in the coupling member 102 to lock the coupling member 102 to the circuit board 52. The base 126 of the stuffer pin 124 is positioned flush with a bottom surface 144 of the circuit board 52. The pin member 128 has a width 129 at the retention features 134 that is greater than a diameter 143 of the opening 142. The retention features 134 of the stuffer pin 124 are deformed to create a press-fit with an inner surface 146 of the opening 142. Alternatively, the inner surface 146 may be deformed to receive the retention features 134 of the stuffer pin 124. In another embodiment, both the inner surface 146 of the coupling member 102 and the retention features 134 of the stuffer pin 124 are deformable.

Figure 4:
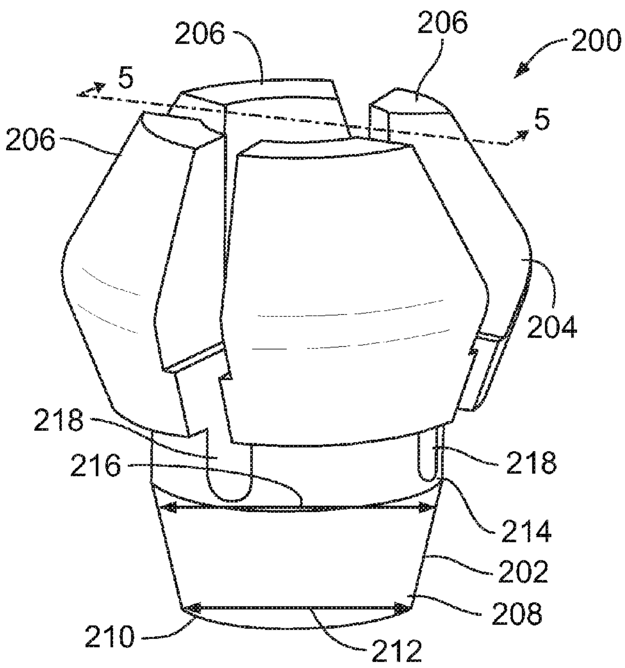
FIG. 4 is a perspective view of an alignment pin formed in accordance with an embodiment.
Figure 5:
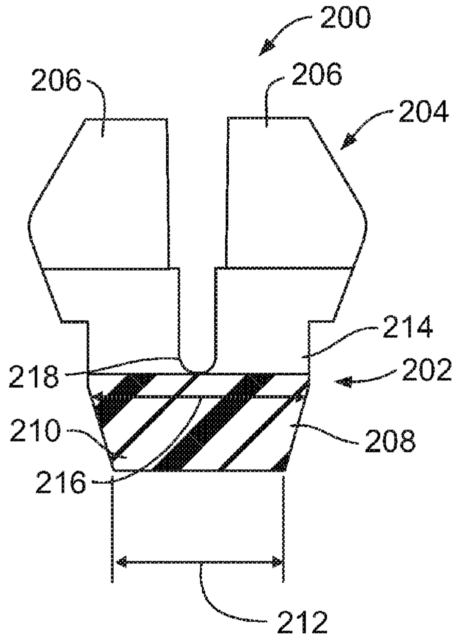
FIG. 5 is a cross-sectional view of the alignment pin, shown in FIG. 4.

FIG. 4 illustrates an alignment pin 200 formed in accordance with an alternative embodiment and that may be used with the electronic assembly 50 in place of the alignment pin 100. FIG. 5 is a cross-sectional view of the alignment pin 200. The alignment pin 200 includes a coupling member 202 and an alignment member 204. The alignment member 204 includes flanges 206 that are configured to engage the module 54. For example, the flanges 206 may engage a recess 72 of the module 54. The alignment member 204 may include any number of flanges 206. In an exemplary embodiment, only one flange 206 engages the recess 72. Providing multiple flanges 206 reduces an amount of positioning required to align the alignment member 204 with respect to the module 54. Optionally, multiple flanges 206 may be configured to engage the module 54. The flanges 206 may be flexible to enable engagement with modules 54 of varying size. The flanges 206 may also provide a force on the module 54 to retain the module on the circuit board 52.

The coupling member 202 includes a tapered end 208 that functions as a retention feature. An insertion end 210 of the tapered end 208 has a diameter 212. The diameter 212 is smaller than a diameter 132 of the circuit board aperture 60. An engagement end 214 of the tapered end 208 has a diameter 216. The diameter 216 is greater than the diameter 212. The tapered end 208 increases in diameter from the insertion end 210 to the engagement end 214. The diameter 216 is also greater than the diameter 132 of the aperture 60. The diameter 212 enables initial insertion of the coupling member 202 into the aperture 60. As the coupling member 202 is inserted into the aperture 60, the tapered end 208 engages the inner surface 74 of the aperture 60. The coupling member 202 also includes recesses 218. The recesses 218 enable deformation of the coupling member 202. The tapered end 208 and, in particular, the engagement end 214, deforms to enable a press-fit between the engagement end 214 and the inner surface 74 of the aperture 60. Alternatively, the inner surface 74 of the aperture 60 deforms to allow insertion of the engagement end 214 of the coupling member 202. In another embodiment, the inner surface 74 and the tapered end 208 deform. In an exemplary embodiment, the coupling member 202 is configured to provide a press-fit with apertures 60 having varying diameters 132.

Figure 6:
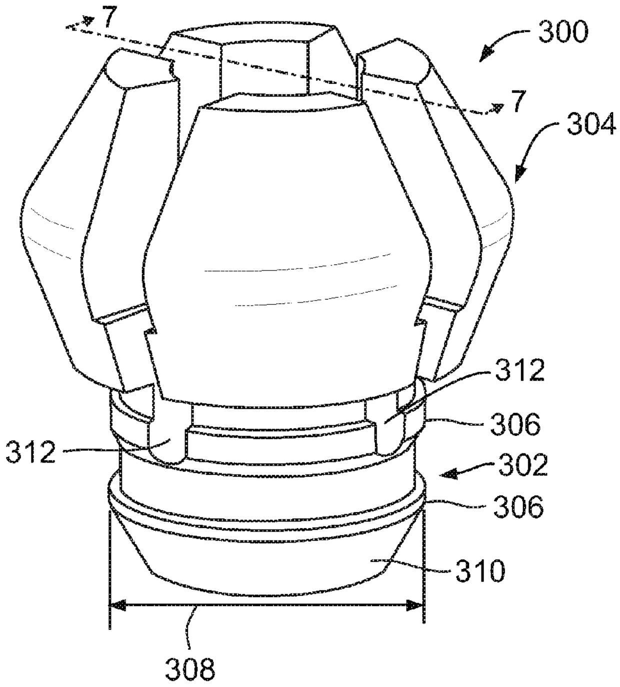
FIG. 6 is a perspective view of an alignment pin formed in accordance with an embodiment.
Figure 7:
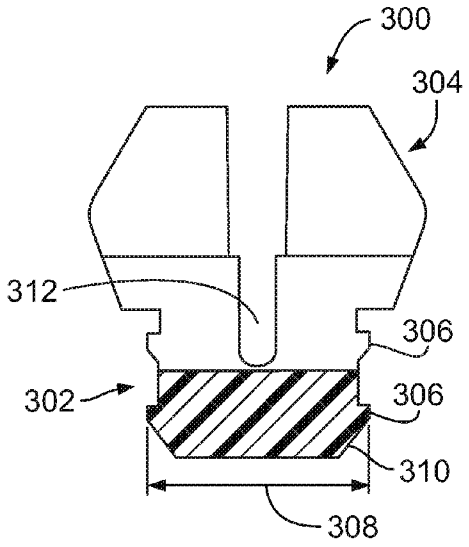
FIG. 7 is a cross-sectional view of the alignment pin, shown in FIG. 6.

FIG. 6 illustrates an alignment pin 300 formed in accordance with an alternative embodiment and that may be used in place of the alignment pin 100. FIG. 7 is a cross-sectional view of the alignment pin 300. The alignment pin 300 includes a coupling member 302 and an alignment member 304 extending from the coupling member 302. The alignment member 304 is the same as the alignment member 204 illustrated in FIGS. 4 and 5.

The coupling member 302 includes ribs 306 that function as retention features. The illustrated embodiment shows two ribs 306. Optionally, the coupling member 302 may include any number of ribs 306. The ribs 306 extend along a circumference of the coupling member 302. The ribs 306 may only extend along a portion of the circumference of the coupling member 302. Alternatively, the ribs 306 may extend in any direction along the circumference of the coupling member 302. The coupling member 302 has a cross-sectional width 308 at the ribs 306 that is greater than the diameter 132 of the circuit board aperture 60. The ribs 306 are configured to deform as the coupling member 302 is inserted into the aperture 60. Alternatively, the inner surface 74 of the aperture 60 may deform to receive the ribs 306. In another embodiment, both the inner surface 74 of the aperture 60 and the ribs 306 deform. The ribs 306 create a press-fit with the inner surface 74 of the aperture 60.

The coupling member 302 also includes a tapered end 310 that may function as a retention feature. The tapered end 310 enables insertion of the coupling member 302 into the aperture 60. The coupling member 302 may deform to create a press-fit between the ribs 306 and the inner surface 74 of the aperture 60. The coupling member 302 also includes recesses 312 that enable deformation of the coupling member 302. In an exemplary embodiment, the coupling member 302 is configured to provide a press-fit with apertures 60 having varying diameters 132.

Figure 8:
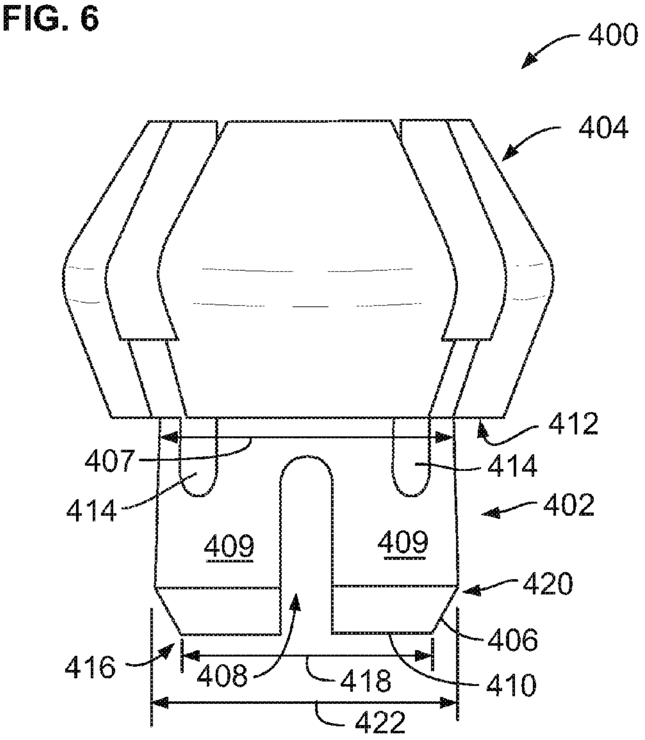
FIG. 8 is a perspective view of an alignment pin formed in accordance with an embodiment.

FIG. 8 is an alignment pin 400 formed in accordance with an alternative embodiment and that may be used with the electronic assembly 50. The alignment pin 400 includes a coupling member 402 and an alignment member 404. The alignment member 404 is the same as the alignment member 204 illustrated in FIGS. 4 and 5.

The coupling member 402 includes flanges 409 and a tapered end 406 that enables the coupling member 402 to be inserted into the aperture 60. The tapered end 406 also functions as a retention feature when the coupling member 402 is engaged with the aperture 60. Recesses 408 extend from an end 410 of the coupling member 402 toward an opposite end 412. Recesses 414 extend from end 412 toward end 410. The recesses 408 and 414 may extend any length of the coupling member 402. The recesses 408 and 414 allow for deformation of the coupling member 402.

An insertion end 416 of the tapered end 406 has a width 418 that is less than the diameter 132 of the aperture 60. An engagement end 420 of the tapered end 406 has a width 422 that is greater than the diameter 132 of the aperture 60. The width 418 accommodates inserting the coupling member 402 into the aperture 60. The coupling member 402 deforms upon insertion into the aperture 60 so that the engagement end 420 is press-fit with the inner surface 74 of the aperture. The coupling member 402 also has a width 407 proximate to the alignment member 404. The width 407 is less than the width 422 of the engagement end 420. During insertion into the aperture 60, the flanges 409 may collapse to provide a press-fit with the aperture 60. In another embodiment, the inner surface 74 of the aperture 60 may deform. In another embodiment, both the inner surface 74 and the coupling member 402 deform. In an exemplary embodiment, the coupling member 402 is configured to provide a press-fit with apertures 60 having varying diameters 132.

Figure 9:
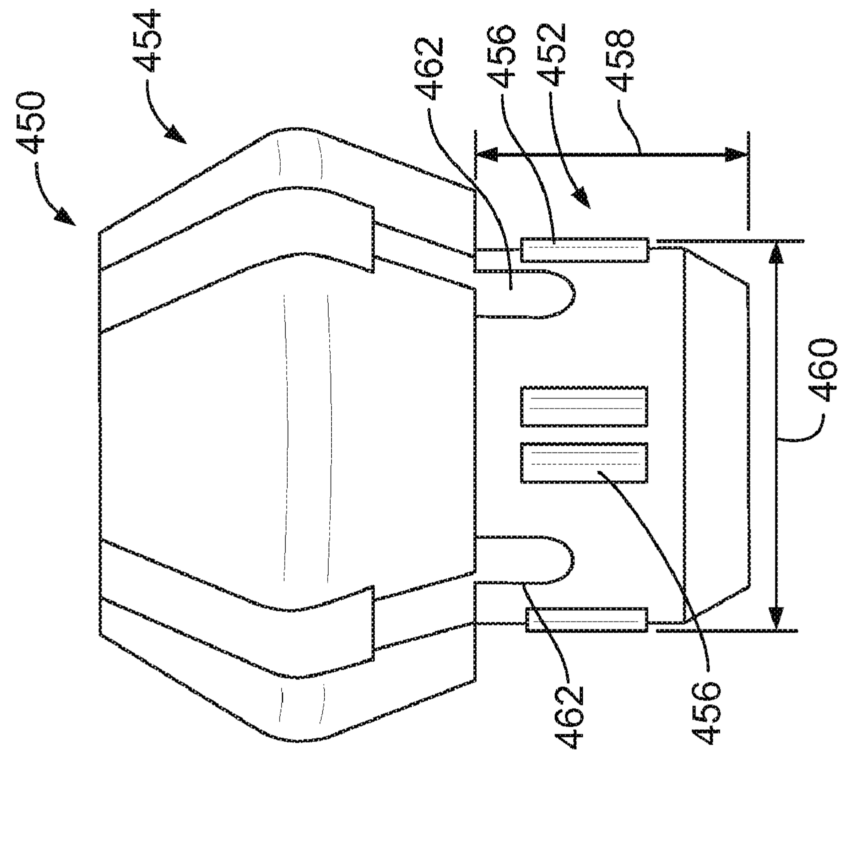
FIG. 9 is a perspective view of an alignment pin formed in accordance with an embodiment.

FIG. 9 is an alignment pin 450 formed in accordance with an alternative embodiment and that may be used with the electronic assembly 50. The alignment pin 450 includes a coupling member 452 and an alignment member 454. The alignment member 454 is the same as the alignment member 204 illustrated in FIGS. 4 and 5.

The coupling member 452 includes ribs 456 that extend a portion of the length 458 of the coupling member 452. The ribs 456 may extend any portion of the length 458. Optionally, the ribs 456 may extend the entire length 458 of the coupling member 452. The ribs 456 are positioned in pairs. Alternatively, the ribs 456 may be positioned independently. The ribs 456 may also be provided in any number. The ribs 456 function as retention features to retain the alignment pin 450 within the circuit board 52. The coupling member 452 has a width 460 at the ribs 456 that is greater than the diameter 132 of the aperture 60. The coupling member 452 is configured to deform so that the ribs 456 press-fit against the inner surface 74 of the aperture 60. Recesses 462 are provided to assist in the deformation of the coupling member 452. In an exemplary embodiment, the coupling member 452 is configured to provide a press-fit with apertures 60 having varying diameters 132.

Figure 10:
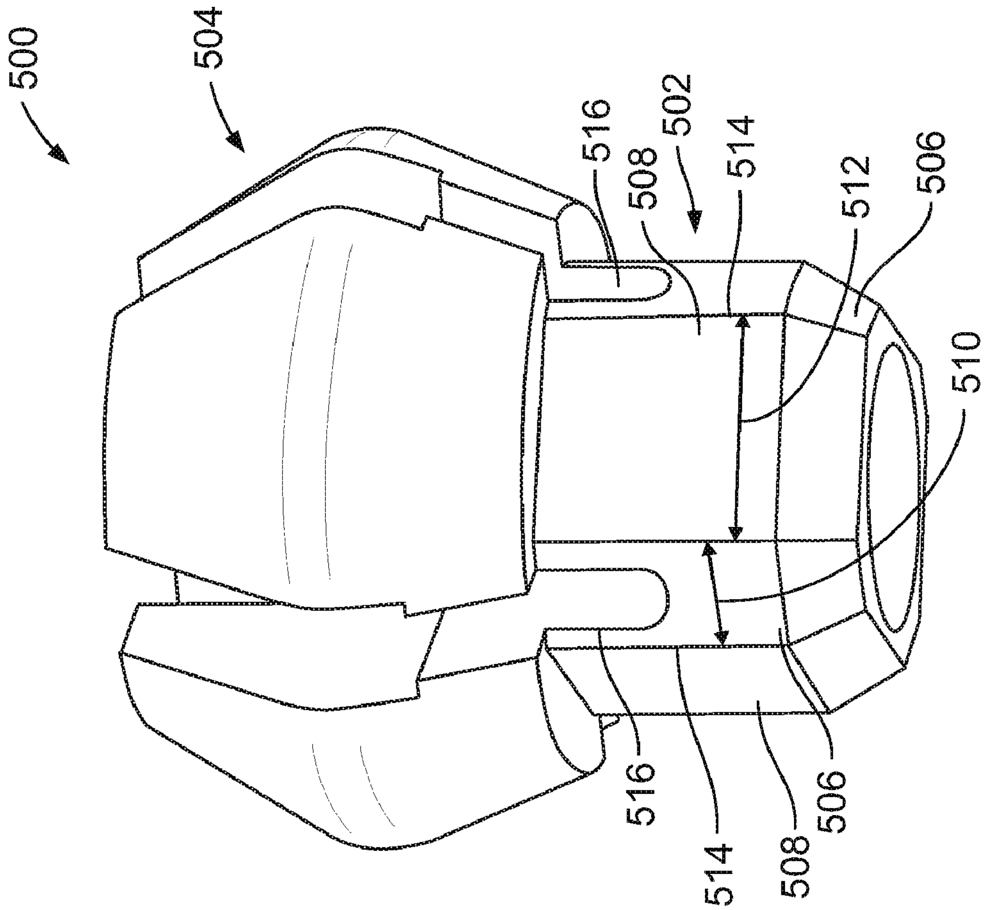
FIG. 10 is a perspective view of an alignment pin formed in accordance with an embodiment.

FIG. 10 is an alignment pin 500 formed in accordance with an alternative embodiment and that may be used with the electronic assembly 50. The alignment pin 500 includes a coupling member 502 and an alignment member 504. The alignment member 504 is the same as the alignment member 204 illustrated in FIGS. 4 and 5.

The coupling member 502 includes flat sides 506 and flat sides 508. The flat sides 506 extend between adjacent flat sides 508. The flat sides 506 have a length 510 that is less than a length 512 of the flat side 508. Alternatively, the sides 506 and 508 may have the same length. The sides 506 and 508 intersect to form corners 514 that function as retention features configured to engage the inner surface 74 of the aperture 60. The coupling member 502 includes recesses 516 that allow deformation of the coupling member 502 so that a press-fit is created between the corners 514 and the inner surface 74. In an exemplary embodiment, the coupling member 502 is configured to provide a press-fit with apertures 60 having varying diameters 132.

Figure 11:
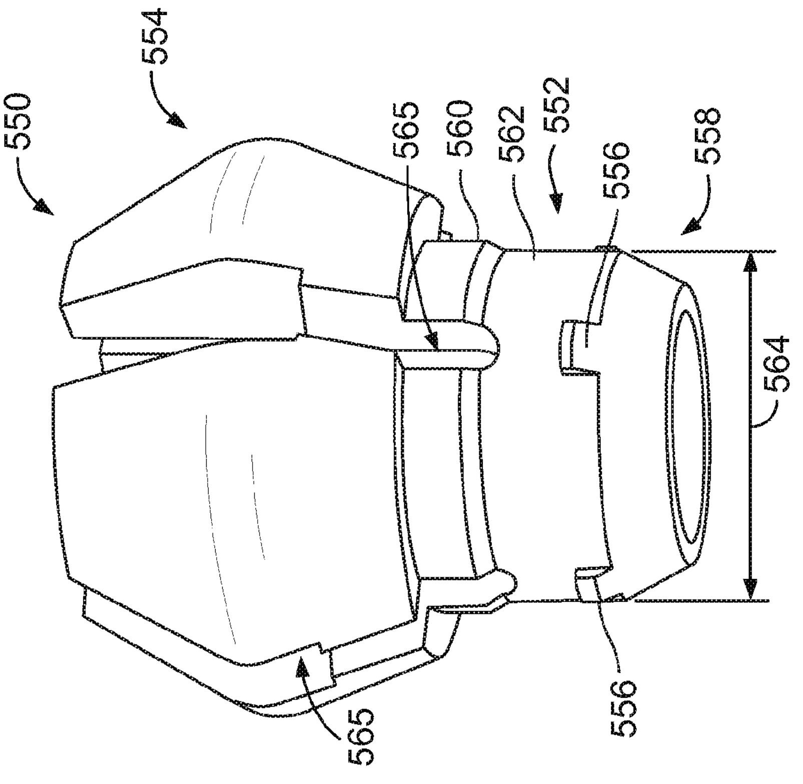
FIG. 11 is a perspective view of an alignment pin formed in accordance with an embodiment.

FIG. 11 is an alignment pin 550 formed in accordance with an alternative embodiment and that may be used with the electronic assembly 50. The alignment pin 550 includes a coupling member 552 and an alignment member 554. The alignment member 554 is the same as the alignment member 204 illustrated in FIGS. 4 and 5.

The coupling member 552 includes tabs 556 positioned proximate to an end 558 of the coupling member 552. Optionally, the tabs 556 may be positioned at any location of the coupling member 552. The coupling member 552 also includes a ring 560 positioned proximate to the alignment member 554. The tabs 556 and the ring 560 function as retention features that engage the inner surface 74 of the aperture 60 formed in the circuit board 52. An indentation 562 is positioned between the ring 560 and the tabs 556. The indentation 562 is configured to not engage the inner surface 74. The indentation 562 provides stress relief between the inner surface 74 and the coupling member 552.

The coupling member 552 has a width 564 at the ring 560 and the tabs 556 that is greater than the diameter 132 of the aperture 60. The coupling member 552 deforms to provide a press-fit between the ring 560 and tabs 556 and the inner surface 74 of the aperture 60. Recesses 565 enable deformation of the coupling member 552. In an exemplary embodiment, the coupling member 552 is configured to provide a press-fit with apertures 60 having varying diameters 132.

Figure 12:
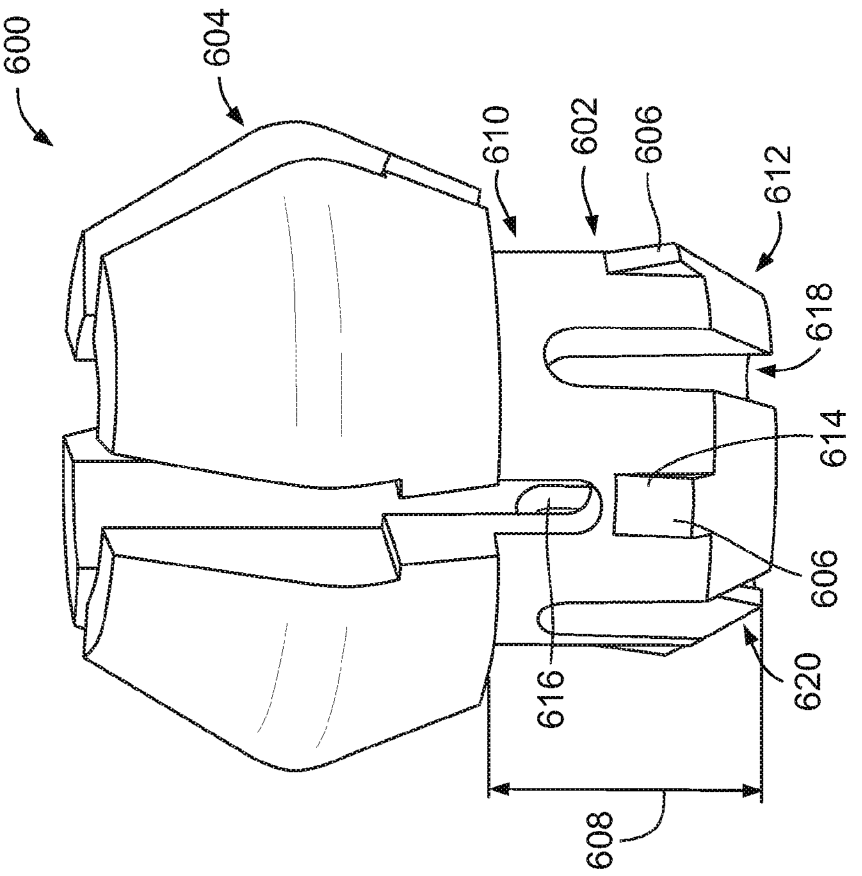
FIG. 12 is a perspective view of an alignment pin formed in accordance with an embodiment.

FIG. 12 is an alignment pin 600 formed in accordance with an alternative embodiment and that may be used with the electronic assembly 50. The alignment pin 600 includes a coupling member 602 and an alignment member 604. The alignment member 604 is the same as the alignment member 204 illustrated in FIGS. 4 and 5.

The coupling member 602 includes tabs 606 that extend a portion of a length 608 of the coupling member 602. Alternatively, the tabs 606 may extend the entire length 608 of the coupling member 602. The tabs 606 are tapered outward from an end 610 that is proximate the alignment member 604 to an end 612 that is distal from the alignment member 604. In another embodiment, the tab 606 may taper outward from the end 612 to the end 610. Optionally, the tab 606 may not be tapered. The tab 606 may have a planar surface 614. In alternative embodiments, the tab 606 may have a non-planar surface that includes ribs, notches, protrusions, grooves, or the like.

The tabs 606 function as retention features that engage the inner surface 74 of the aperture 60 formed in the circuit board 52. The tabs 606 may deform to create a press-fit with the inner surface 74. Alternatively, the inner surface 74 may deform to receive the tabs 606. In another embodiment, both the inner surface 74 and the tabs 606 are deformable. The coupling member 602 includes recesses 616 positioned above each tab 606 and recesses 618 positioned between adjacent tabs 606. The recesses 616 and 618 provide stress relief between the inner surface 74 and the coupling member 602 to enable deformation of the coupling member 602.

The coupling member 602 also includes a tapered end 620 that may function as a retention feature by providing a press-fit engagement between the tapered end 620 and the inner surface 74 of the aperture 60. The end 612 of each tab 606 is positioned proximate to the tapered end 620. Alternatively, the tabs 606 may extend onto the tapered end 620. The tapered end 620 may also include tabs independently positioned thereon.

Figure 13:
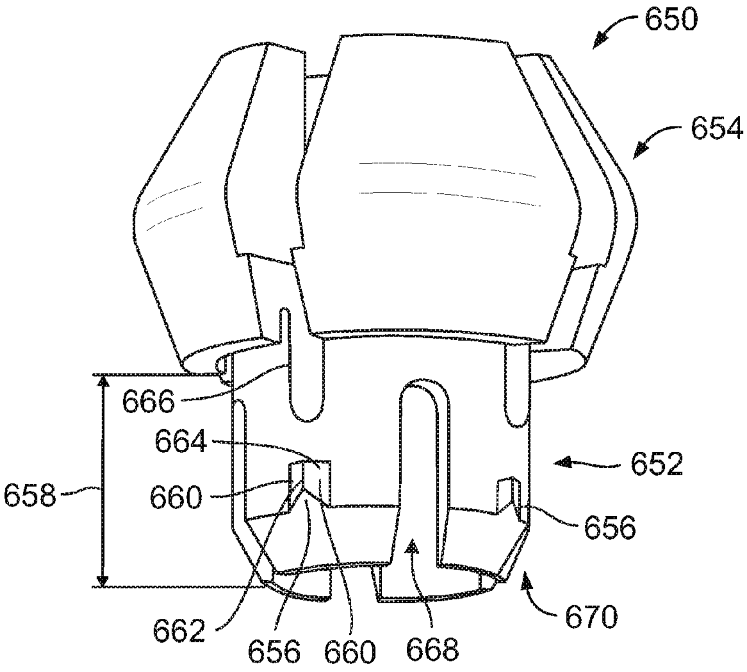
FIG. 13 is a perspective view of an alignment pin formed in accordance with an embodiment.

FIG. 13 is an alignment pin 650 formed in accordance with an alternative embodiment and that may be used with the electronic assembly 50. The alignment pin 650 includes a coupling member 652 and an alignment member 654. The alignment member 654 is the same as the alignment member 204 illustrated in FIGS. 4 and 5.

The coupling member 652 includes tabs 656 that extend therefrom. The tabs 656 may extend the entire length 658, or a portion of the length 658, of the coupling member 652. The tabs 656 have a pair of sides 660 that taper outward to a point 662. The sides 660 may have planar surfaces 664. In alternative embodiments, the sides 660 may have non-planar surfaces that include ribs, notches, protrusions, grooves, or the like.

The tabs 656 function as retention features that engage the inner surface 74 of the aperture 60 formed in the circuit board 52. The tabs 656 may deform to create a press-fit with the inner surface 74. Alternatively, the inner surface 74 may deform to receive the tabs 656. In another embodiment, both the inner surface 74 and the tabs 656 are deformable. The coupling member 652 includes recesses 666 positioned above each tab 656 and recesses 668 positioned between adjacent tabs 656. The recesses 666 and 668 provide stress relief between the inner surface 74 and the coupling member 652 to enable deformation of the coupling member 652.

The coupling member 652 also includes a tapered end 670 that may function as a retention feature by providing a press-fit engagement between the tapered end 670 and the inner surface 74 of the aperture 60. The tabs 656 are positioned proximate to the tapered end 670. Alternatively, the tabs 656 may extend onto the tapered end 670. The tapered end 670 may also include tabs independently positioned thereon.

Figure 14:
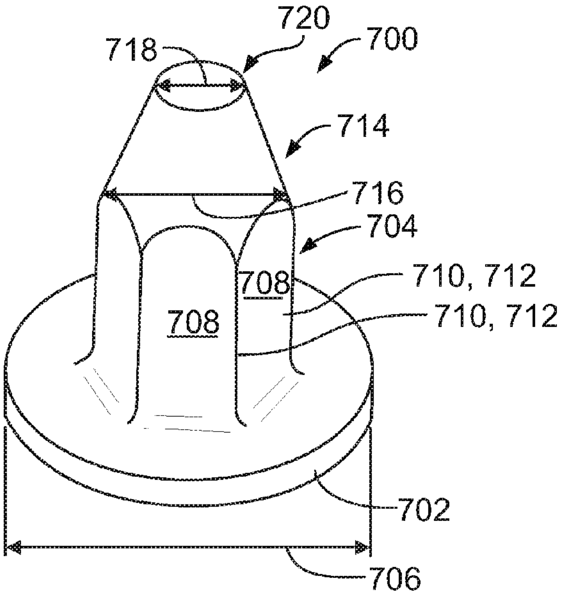
FIG. 14 is a perspective view of a stuffer pin formed in accordance with an embodiment that may be used with an electronic assembly.

FIG. 14 illustrates a stuffer pin 700 formed in accordance with an alternative embodiment and that may be used with an electronic assembly, for example electronic assembly 50. The stuffer pin 700 is configured to be received within a coupling member, for example, the coupling member 102, shown in FIG. 2. Optionally, the stuffer pin 700 may be used with any one of coupling members 202, 302, 402, 452, 502, 552, 602, and/or 652 illustrated in FIGS. 4-13.

The stuffer pin 700 includes a base 702 and a pin member 704 extending from the base 702. The base 702 is illustrated as circular, but may have any shape. The base 702 has a width 706 that is greater than the diameter 132 of the aperture 60 formed in the circuit board 52. The base 702 is configured to position flush with the circuit board 52 when the stuffer pin 700 is inserted into a coupling member 102.

The pin member 704 includes a plurality of flat sides 708. The flat sides 708 intersect at corners 710. The corners 710 operate as retention features 712 to retain the stuffer pin 700 within the coupling member 102. The retention features 712 deform to engage the inner surface 146 of the opening 142 formed in the coupling member 102. Optionally, the opening 142 formed in the coupling member 102 may deform to receive the retention features 712. In another embodiment, both the opening 142 and the retention features 712 are deformable. The retention features 712 create an interference fit with the coupling member 102. The stuffer pin 700 is retained with the coupling member 102 through a frictional force generated by the interference fit.

The pin member 704 also includes a tapered end 714. The tapered end 714 has a first width 716 that is greater than a diameter 143 of the opening 142 formed in the coupling member 102. The tapered end 714 has a second width 718 and an end 720 of the pin member 704. The second width 718 is less than the diameter 143 of the opening 142. The second width 718 enables the stuffer pin to be inserted into the coupling member 102. The first width 716 may also operate as a retention feature by deforming to create an interference fit with the coupling member 102. The tapered end 714 and the retention features 712 may be utilized alone or in combination.

Figure 15:
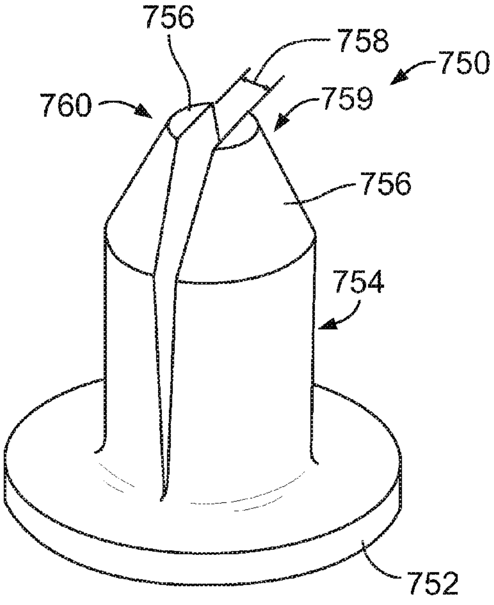
FIG. 15 is a perspective view of a stuffer pin formed in accordance with an embodiment that may be used with an electronic assembly.

FIG. 15 illustrates a stuffer pin 750 formed in accordance with an alternative embodiment. The stuffer pin 750 includes a base 752 and a pin member 754 extending from the base 752. The pin member 754 includes flexible flanges 756. The illustrated embodiment includes two flexible flanges 756. However, the pin member 754 may include any number of flexible flanges 756. A gap 758 is positioned between, and separates, the flanges 756. The flanges 756 are configured to move toward one another by at least partially closing the gap 758 when force is exerted on the flanges 756. The flanges 756 operate as a retention feature to create an interference fit with the coupling member 102. When inserted into the coupling member 102, the flanges 756 are pushed toward one another to enable the stuffer pin 750 to be received within the coupling member 102. Once inserted into the coupling member 102, the flanges 756 create an interference fit with the coupling member 102 to retain the stuffer pin 750 therein.

The stuffer pin 750 also includes a tapered end 759. The tapered end 759 increases in diameter from an end 760 of the stuffer pin 750 to the base 752. The tapered end 759 may also function as a retention feature to retain the stuffer pin 750 within the coupling member 102. The tapered end 759 and the flanges 756 may be utilized alone or in combination.

Figure 16:
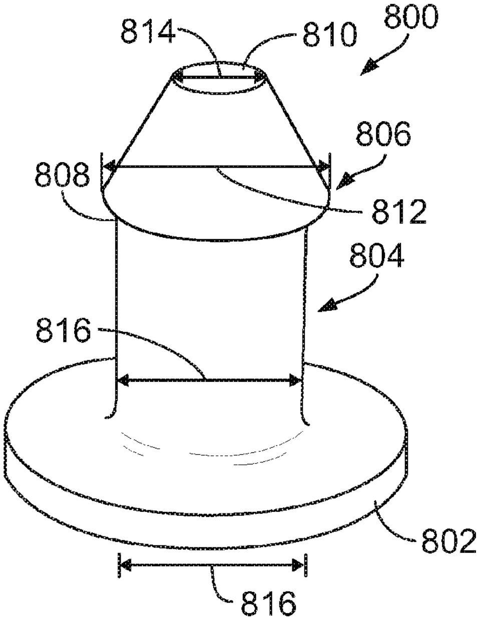
FIG. 16 is a perspective view of a stuffer pin formed in accordance with an embodiment that may be used with an electronic assembly.

FIG. 16 illustrates a stuffer pin 800 formed in accordance with an alternative embodiment. The stuffer pin 800 includes a base 802 and a pin member 804 extending from the base 802. A retention feature 806 is positioned at an end of the pin member 804 opposite the base 802. The retention feature 806 includes a first end 808 proximate to the pin member 804 and a second end 810 opposite the first end 808. The first end 808 has a first diameter 812 and the second end has a second diameter 814. The first diameter 812 is greater than the second diameter 814. The first diameter 812 is also greater than a diameter 816 of the pin member 804 so that the first end 808 of the retention feature 806 steps out from the pin member 804.

The first diameter 812 is greater than the diameter 143 of the opening 142 in the coupling member 102. The second diameter 814 is less than the diameter 143 of the opening 142. The second diameter 814 enables the stuffer pin 800 to be inserted into the coupling member 102. The first diameter 812 engages a surface of the coupling member opening 142 and creates an interference fit between the stuffer pin 800 and the coupling member 102.

Figure 17:
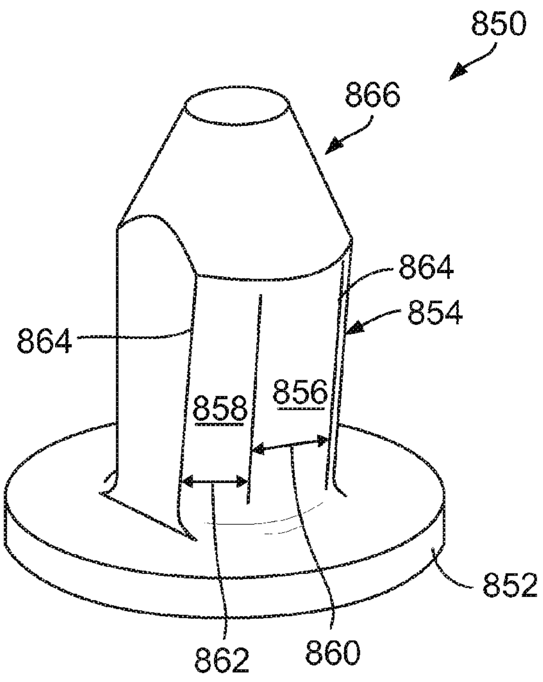
FIG. 17 is a perspective view of a stuffer pin formed in accordance with an embodiment that may be used with an electronic assembly.

FIG. 17 illustrates a stuffer pin 850 formed in accordance with an alternative embodiment. The stuffer pin 850 includes a base 852 and a pin member 854 extending from the base 852. The pin member 854 includes first sides 856 and second sides 858. The first sides 856 have a length 860 that is greater than a length 862 of the second sides 858. Each first side 856 is positioned between adjacent second sides 858. The first side 856 and the second sides 858 intersect at corners 864. The corners 864 function as retention features that create an interference fit with the coupling members 102. The stuffer pin 850 also includes a tapered end 866 that may also function as a retention feature.

Figure 18:
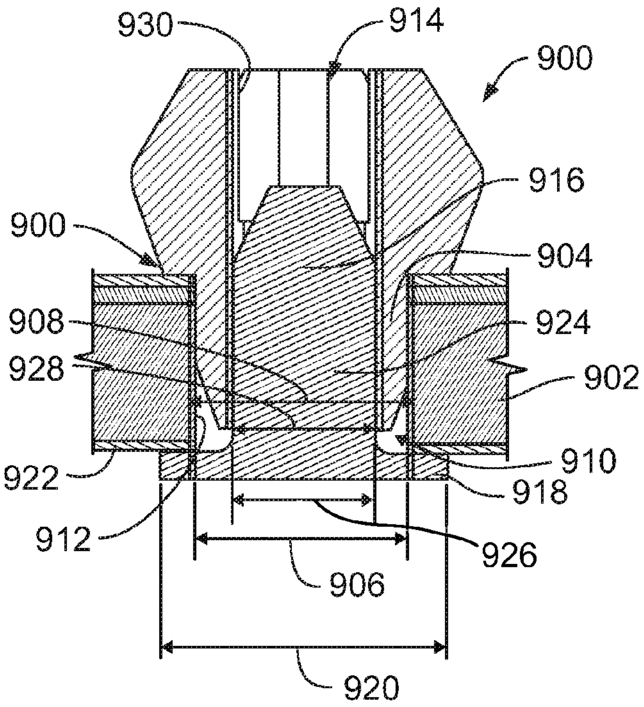
FIG. 18 is a cross-sectional view of an alignment pin engaged with a circuit board.

FIG. 18 is a cross-sectional view of an alignment pin 900 engaged with a circuit board 902. The alignment pin 900 includes a coupling member 904 having a cross-sectional width 906 that is greater than a cross-sectional width 908 of an aperture 910 formed in the circuit board 902. The coupling member 904 deforms to create a press-fit with an inner surface 912 of the aperture 910. Alternatively, the inner surface 912 of the aperture deforms to receive the coupling member 904.

The coupling member 904 has an opening 914 formed therein. The opening 914 is configured to receive a stuffer pin 916. The stuffer pin 916 has a base 918 having width 920 that is greater than the width 908 of the aperture. The base 918 is positioned flush with a bottom surface 922 of the circuit board 902. The stuffer pin 916 also includes a pin member 924 having a width 926 that is greater than a width 928 of the opening 914 formed in the coupling member 904. The pin member 924 deforms to create a press-fit with an inner surface 930 of the opening 914. Alternatively, the coupling member 904 deforms to receive the pin member 924.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments of the invention without departing from their scope. While the dimensions and types of materials described herein are intended to define the parameters of the various embodiments of the invention, the embodiments are by no means limiting and are exemplary embodiments. Many other embodiments will be apparent to those of skill in the art upon reviewing the above description. The scope of the various embodiments of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments of the invention, including the best mode, and also to enable any person skilled in the art to practice the various embodiments of the invention, including making and using any devices or systems and performing any incorporated methods. The patentable scope of the various embodiments of the invention is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. An alignment pin comprising:

an alignment member configured to extend from a surface of a circuit board, the alignment member having a flange that engages a recess of an electronic module, the recess formed in an exterior side wall or a corner formed by exterior side walls of the electronic module, the flange comprising a flange shape corresponding to a recess shape of the recess and aligning and retaining the electronic module on the circuit board; and a coupling member extending from the alignment member, the coupling member configured to be through hole mounted to an aperture in the circuit board, the coupling member having a retention feature that creates a press-fit between an inner surface of the aperture and the coupling member, the coupling member having a cross-sectional width at the retention feature that is greater than a diameter of the aperture, the retention feature accommodating a press-fit with apertures having different diameters.

2. The alignment pin of claim 1, wherein the coupling member has multiple flat sides, the retention feature formed at a corner formed by a pair of the flat sides.

3. The alignment pin of claim 1, wherein a bottom of the coupling member has a diameter that is greater than a diameter of the top of the coupling member, the retention feature formed at the bottom of the coupling member.

4. The alignment pin of claim 1, wherein a top of the coupling member has a diameter that is greater than a diameter of the bottom of the coupling member, the retention feature formed at the top of the coupling member.

5. The alignment pin of claim 1, wherein the retention feature includes a rib positioned along an outer surface of the coupling member.

6. The alignment pin of claim 1, wherein the retention feature includes a rib extending along a perimeter of the coupling member.

7. The alignment pin of claim 1, wherein the coupling member includes an indentation, the indentation free from contact with the surface of the aperture when the coupling member is through hole mounted to the aperture.

8. The alignment pin of claim 1, wherein the coupling member includes a flange, wherein the flange of the coupling member is flexible to accommodate apertures having varying diameters.

9. The alignment pin of claim 1, wherein the retention feature is tapered.

10. The alignment pin of claim 1, wherein the flange of the alignment member is flexible to provide an interference fit with the electronic module.

11. The alignment pin of claim 1 further comprising a stuffer pin configured to extend through the circuit board and to be received in an opening formed in the coupling member of the alignment pin, the stuffer pin securing the alignment pin to the circuit board.

12. The alignment pin of claim 1, wherein the flange of the alignment member is configured to align and retain the electronic module directly on the circuit board.

13. An electronic assembly comprising:

a circuit board having an electrical connector positioned thereon, the circuit board having an aperture extending therethrough;

an electronic module engaging the electrical connector, the electronic module having exterior side walls extending substantially perpendicularly from the circuit board when the electronic module engages the electrical connector, the electronic module comprising a recess in at least one of the exterior side walls; and an alignment pin to align the electronic module with respect to the electrical connector, the alignment pin comprising:

an alignment member having a flange that engages the electronic module, the flange comprising a flange shape corresponding to a recess shape of the recess and aligning and retaining the electronic module on the circuit board; and a coupling member extending from the alignment member, the coupling member through hole mounted to the aperture in the circuit board, the coupling member having a retention feature that creates a press-fit between an inner surface of the aperture and the coupling member, the coupling member having a cross-sectional width at the retention feature that is greater than a diameter of the aperture, the retention feature accommodating a press-fit with apertures having different diameters.

14. The electronic assembly of claim 13, wherein coupling member has multiple flat sides, the retention feature formed at a corner formed by a pair of the flat sides.

15. The electronic assembly of claim 13, wherein the coupling member has varying diameters along a length of the coupling member, the retention feature formed at the greatest diameter of the coupling member.

16. The electronic assembly of claim 13, wherein the retention feature includes a rib positioned along an outer surface of the coupling member.

17. The electronic assembly of claim 13, wherein the coupling member includes a flange, wherein the flange of the coupling member is flexible to accommodate apertures having varying diameters.

18. The electronic assembly of claim 13, wherein the coupling member includes a recess to allow deformation of the coupling member.

19. The electronic assembly of claim 13 further comprising a stuffer pin extending through the circuit board and received in the coupling member of the alignment pin, the stuffer pin securing the alignment pin to the circuit board.

20. The electronic assembly of claim 13, wherein the flange of the alignment member is configured to align and retain the electronic module directly on the circuit board.

* * * * *